United States Patent
Pasotti et al.

(10) Patent No.: US 6,292,398 B1
(45) Date of Patent: Sep. 18, 2001

(54) METHOD FOR THE IN-WRITING VERIFICATION OF THE THRESHOLD VALUE IN NON-VOLATILE MEMORIES

(75) Inventors: Marco Pasotti, S. Martino Sicc.; Giovanni Guaitini, Trecella; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/569,232

(22) Filed: May 11, 2000

(30) Foreign Application Priority Data

May 11, 1999 (IT) ............................... MI99A1017

(51) Int. Cl.$^7$ ................................... G11C 16/06
(52) U.S. Cl. ............... 365/185.21; 365/185.03; 365/185.22; 365/185.24; 365/185.19
(58) Field of Search ............... 365/185.21, 185.03, 365/185.22, 185.24, 185.19, 185.33, 185.2

(56) References Cited

U.S. PATENT DOCUMENTS 5,701,265 * 12/1997 Calligaro et al. ............... 365/185.03
5,917,753 * 6/1999 Dallabora et al. ............... 365/185.21
5,930,167 * 7/1999 Lee et al. ........................ 365/185.03

* cited by examiner

Primary Examiner—David Nelms
Assistant Examiner—David Lam
(74) Attorney, Agent, or Firm—Theodore E. Galanthay; Robert Iannucci; Seed IP Law Group, PLLC

(57) ABSTRACT

A method for the in-writing verification of the threshold value of the multilevel cells suitable to memorize n bits each, that provides for the utilization of a sense amplifier containing a respective successive approximation register. An output signal of a comparison circuit provides for the loading of the datum to be programmed in the cell being selected, after which a programming pulse is applied and the comparison between the reference current corresponding to said datum and the current that flows in the cell is carried out. The application of the programming pulse and the performance of the comparison are then repeated until it is verified that the current of the cell is smaller than the reference current.

14 Claims, 5 Drawing Sheets

METHOD FOR THE IN-WRITING VERIFICATION OF THE THRESHOLD VALUE IN NON-VOLATILE MEMORIES

TECHNICAL FIELD

The present invention refers to a method for the in-writing verification of the value of the threshold voltage in non-volatile memories and particularly in flash cells.

BACKGROUND OF THE INVENTION

The market demand for non-volatile memories with higher and higher memory capacity imposes on the manufacturers of semiconductors a continuous effort in the reduction of the dimension of the devices and in the increase of the density of stored data.

In order to increase the information storage capacity in a flash memory, that is, in memory cells that maintain their programming state even in the absence of the supply voltage, without necessarily decreasing the physical dimensions of the single cells, the cells must be programmed in such a way that they are able to memorize more than one bit of information, that is the memory cell must be able to have $m=2^n$ different states or programming levels, where n represents the number of bits that can be memorized in the memory cell. This cell is called "multilevel memory cell", where each level corresponds to a different value of the threshold voltage of the transistor making up the cell.

The discrimination of the different m programming levels requires a greater precision in the operations of writing and reading. The stage of writing is realized, for instance, in a such way that memory cell is programmed in one of the different m levels by adequately adjusting its threshold voltage in such a way that, when the memory cell is biased at the desired threshold, during the stage of reading, said cell absorbs a corresponding power at the pre-established level of threshold voltage.

Two reading techniques have been proposed for multi-level memory cells: parallel reading and serial reading.

The parallel reading provides for the generation of m−1 predetermined and distinct reference voltages or currents (current references for the current approach, or voltage references for the voltage approach) and the execution of m−1 simultaneous comparisons of such m−1 distinct reference voltages or currents with a current (or a voltage) derived from the memory cell that is to be read.

The advantages of this technique are the high speed and the independence of the reading time from the programming state of the memory cell; a disadvantage is the large area required by the reading circuit, because m−1 separate comparison circuits are necessary to carry out the m−1 simultaneous comparisons.

The serial reading, instead, requires one single reference (current or voltage) that can be varied according to the prescribed law. This single reference is used in order to carry out a series of subsequent comparisons, and it is varied in order to approximate the voltage or the current that is derived from the memory cell that must be read. The advantage of this technique is that it has a simple circuit realization and the area required is small.

It is evident that the time required for the reading of a memory cell is not uniform, but it depends on the particular programming level of the memory cell and on the starting value of the reference voltage (or current) (the reading time depends on the distance between the programming level of the cell that is to be read and the starting value of the reference voltage or current): in order to determine the programming state of a memory cell at m levels a minimum of one to a maximum of m−1 steps of comparison can be necessary. The reading time soon becomes excessive with the increase of the number of bits that are memorized in a single memory cell.

Therefore, it becomes necessary to speed up all the operations of writing, reading and erasing in such a way that it is possible to meet the specifications of the internationally defined standards for the realization of bulk storage devices that replace the magnetic disk.

In particular a cause for the slowing in the operation of writing is the stage of the verification. In fact, this stage, in addition to providing adequate programming pulses, consists in the continuous control of the value of the threshold voltage that is obtained, while verifying that it is the desired one, after a certain number of pulses have been applied to same cell.

The number of verifications depends on the programming algorithm that is used. In an verification algorithm of the "programming and verification pulse" type (suitable to the multilevel programming of floating gate non-volatile memory cells), the operation of control is carried out after each programming pulse. Instead, by increasing the complexity of the circuitry it is possible to compare directly or indirectly the voltage drop between the gate and source electrodes of the memory cell, which is the value of the memorized voltage threshold, with the desired voltage value, while decreasing the number of verifications to be carried out in order to determine the memorization state of the memory cell.

The operation of reading of the threshold voltage value is equivalent to the operation of verification of the threshold voltage value and therefore the time for the reading of the stored datum coincides with the time for the verification of the stored datum.

It is thus evident that the faster the operation of verification will be, the quicker it will be possible to program the cell.

SUMMARY OF THE INVENTION

An embodiment of the present invention carries out the operation of in-writing verification of the threshold voltage value in a fraction of the reading time.

The embodiment includes a method for the in-writing verification of the threshold value of multilevel cells suitable to memorize n bits each, that provides for the use of a sense amplifier (detection amplifier). The sense amplifier includes a register with n bits, a generator of a reference current that varies as a function of the datum contained in the register, and a circuit for comparing the reference current produced by the current generator and the current that flows in a selected memory cell. The method includes: (a) loading the datum desired to be programmed in the selected memory cell in the register; (b) applying a programming pulse; (c) comparing the reference current corresponding to the datum and the current that flows in the cell: and repeating steps (b), (c) until it is verified that the current of the cell is lower than said reference current.

The value that the current in the memory cell has at the end of the programming operation is already known beforehand.

In the case under examination this can be used advantageously by memorizing the n bits to be written in the memory cell in a register, in such a way that the comparison between the current that flows from the flash cell and the known and constant one at the output of a digital analog conversion device is possible. For each operation of reading, therefore, n cycles of comparison are employed, and if the number of cells to be read is high, this operation involves a considerable expenditure of time.

The operation of verification works differently from the operation of reading: the value of the register in which the data to be written in the memory cell are memorized does never modify, while it is the current in the flash memory cells after each programming pulse that changes. It is possible to deduce, therefore, that for each operation of verification only one cycle of comparison is necessary and this brings about a reduction in verification time.

Owing to the present invention it is possible to realize a method for the programming and verification of multilevel non-volatile cells that is quicker, less expensive in terms of energy, less bulky as regards the traditional methods.

BRIEF DESCRIPTION OF THE DRAWINGS

The characteristics and the advantages of the present invention will become evident from the following detailed description of an embodiment thereof, that is illustrated as a non limiting example in the enclosed drawings, in which.

DETAILED DESCRIPTION OF THE INVENTION

Figure 1:
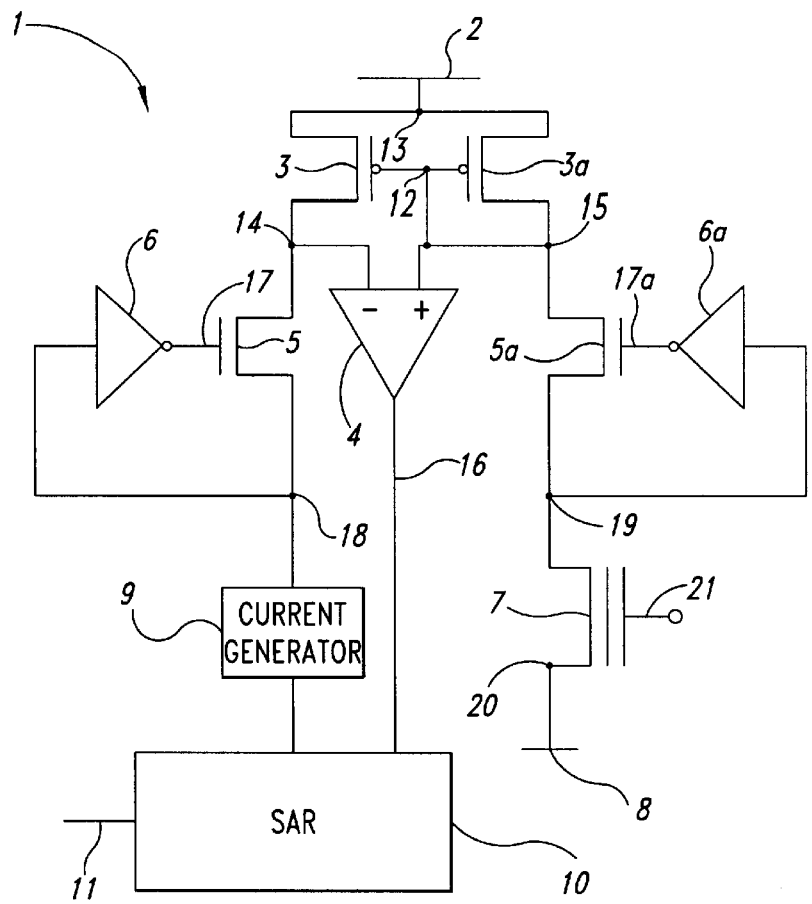
FIG. 1 show a circuit layout of a sense amplifier according to the known technique.

In FIG. 1 a simplified circuit layout of a sector of memory according to the known technique, making up a sense amplifier, is indicated by 1, as a whole.

According to what is illustrated in FIG. 1 it is possible to observe a first horizontal path 2 or supply path; two p type transistors 3, 3A; a comparator 4; two n type transistors 5, 5A; two inverters 6, 6A; a transistor 7 with floating gate; a second horizontal path 8 or ground path; a reference current generator 9; a successive approximations register (SAR) 10; a third horizontal path 11 or timing path (CLOCK line).

The transistors 3, 3A share a gate electrode 12, which is connected with a positive terminal of the comparator 4, and a source electrode 13 connected with the supply path 2.

Each transistor 3, 3A has a drain electrode 14, 15 shared with a source electrode of the respective transistors 5, 5A. In addition the electrode 14 is connected with a negative terminal of the comparator 4 and the electrode 15 is connected with the positive terminal of the comparator 4.

The comparator 4 has an output terminal 16 connected with the successive approximations register 10.

The transistors 5, 5A have respective gate electrodes 17, 17A shared with an output terminal of a respective one of the inverters 6, 6A.

A drain electrode 18 of the transistor 5 is shared with the input terminal of the inverter 6 and is connected with the generator 9, while the electrode 19 of the transistor 5A is shared with the drain electrode of the transistor 7.

The transistor 7 has the shared source electrode 20 connected with the ground path 8 and the gate electrode 21, during the operation of reading of the value of the threshold voltage contained in the same cell 7, is at a fixed potential of +5.5V.

The successive approximations register 10 has at its inputs the timing signal 11 and the output 15 of the comparator 4. An output of the SAR 15 is connected with the reference current generator 9.

The architecture, of known type, of FIG. 1 limits the circuit volume and power consumption. The sense amplifier 1 is capable to read the n bits that are memorized in the cell 7 in n steps of comparison thus allowing an increase in the speed of the reading operation. The structure 1, as a whole, can be repeated in order to carry out the reading operation simultaneously on more cells 7 belonging to the same row since the value of the voltage on the gate electrode 21 during the stage of reading of the cell 7 is constant.

Figure 2:
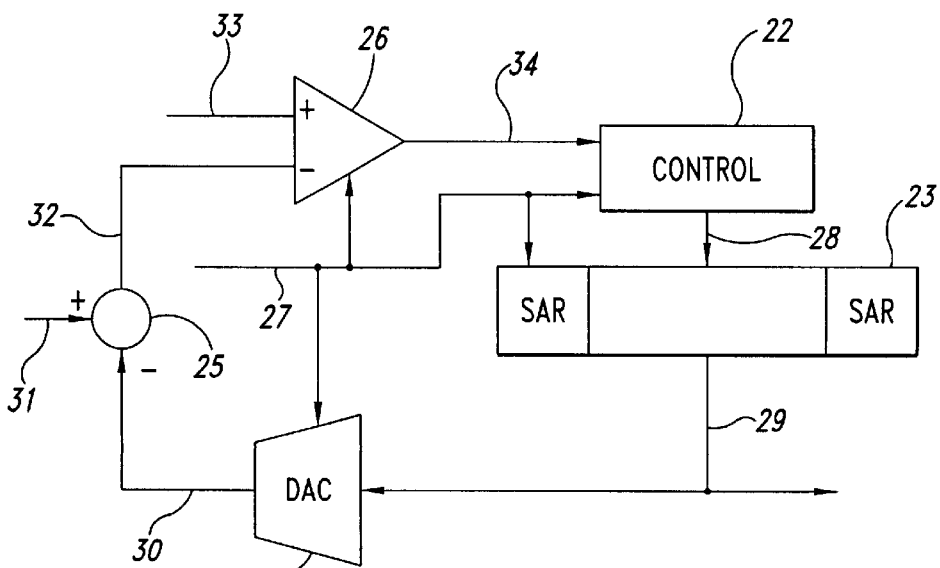
FIG. 2 illustrates a block diagram relative to the method according to an embodiment of the invention, utilizing the sense amplifier in FIG. 1.

In FIG. 2 there is illustrated a block diagram of a structure for in-writing verification of the threshold value in memory cells, that uses the sense amplifier of FIG. 1

According to what illustrated in such figure it is possible to observe a control block 22 and a successive approximations register 23, corresponding as a whole to the register 10 in FIG. 1; a digital-to-analog converter 24 corresponding to the generator 9 in FIG. 1; an adder node 25 corresponding to the node 14 in FIG. 1; a comparator device 26 corresponding to the comparator 4 in FIG. 1; and a timing path 27.

The block 22 receives in input the timing path 27 and an output 34 of the device 26 and it has a path 28 as an output line that serves as an input for the successive approximations register 23. This has an output path 29 that is the input of the digital-to-analog converter 24. The latter has as an output path 30 that is the negative input of the adder node 25 and corresponds to the power that is absorbed by the transistor 5 in FIG. 1 (left branch). The positive input of the node 25 is a path 31, which represents the current that flows from the cell 7. The output 32 of the adder node 25 is the input of the comparator 26. A path 33, which represents a reference value present in the node 15 in FIG. 1, is connected to the positive terminal of the comparator 26.

In the case of serial reading operation, also called "dichotomic", the operation includes a search by successive approximations that, starting from an initial value for the current generated by the generator 9, finds the value of the current of the memory cell 7 after a sequence of iterations. In practice at each step i-th (i=0, . . . , i=n−1) the i-th bit of the successive approximations register 23 is set equal to 1. The content of the register 23 is converted into current by the analog digital device 24 and this current is compared with the one deriving from the flash memory 7, which is constant. In fact the current that flash cell 7 lets through on the path 31 is a function of the value of the memorized threshold voltage so that in a first approximation the result is:

$$I=K(V_{gs}-V_{th}) \cdot V_{ds}$$

where K is a constant depending on the process of manufacture, Vth is the value of the threshold voltage, Vgs is the value of the voltage that is applied on the gate electrode 21, fixed for each flash cell 7, and Vds is the voltage applied on the drain electrode 19.

According to the result of the comparison, carried out by the device 26, the bit is left high, if on the path 34 the current signal is low, or it is set to zero, if on the path 34 the signal is high. Afterwards a new stage begins with the following bit, up to the completion of the locations in the register 23. The iterative research is repeated until the threshold voltage value of the memory cell 7 has been determined.

After a cycle of iteration the first bit to be read on the path 29 is already available, followed by the next bits after each cycle, with reduction of the latency time.

By using this method the programming state of a memory cell 7 with $m=2^n$ different levels of threshold voltage is determined in n steps of comparison, independently from the particular state of programming of the cell 7.

The operation of verification of the threshold voltage level of the memory cell 7 takes place in an opposite way as regards the reading operation: the value stored in the successive approximations register 23 never changes, while the current that flows in the path 31 of the flash cell 7 after each programming pulse is modified, as it will be described in detail hereinafter with reference to FIG. 3.

The flow chart in FIG. 3 referring to the block diagram of FIG. 2 will now be described, with reference to a method for the in-writing verification of flash memory cells.

Figure 3:
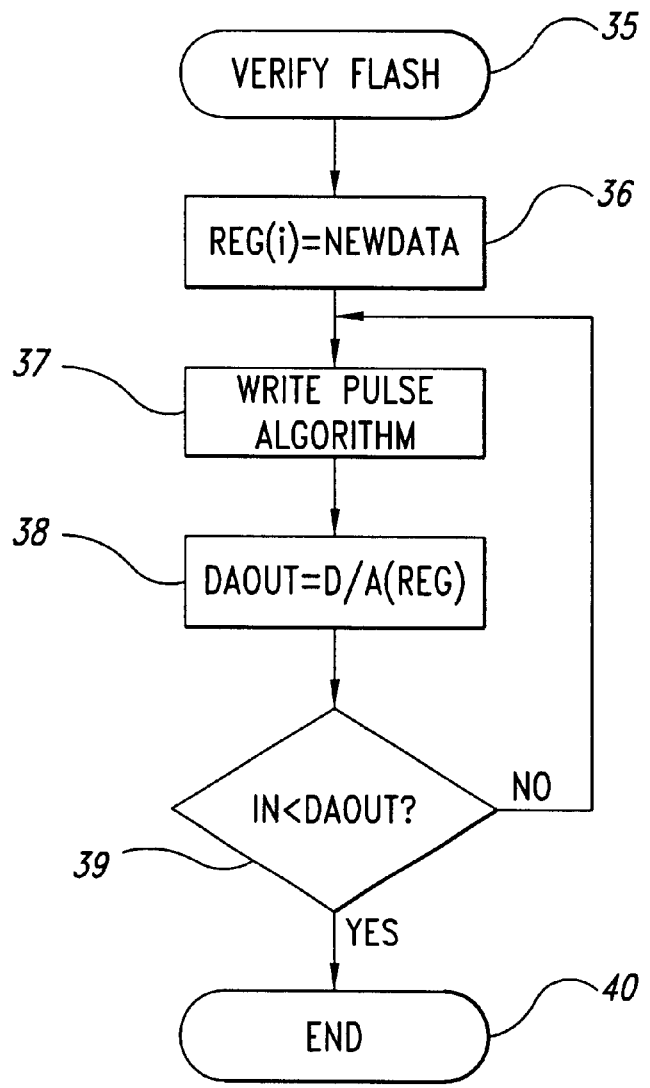
FIG. 3 shows a flow chart relative to the aforesaid method for the in-writing verification.

According to what illustrated in FIG. 3, it is possible to observe an initial block 35, called "VERIFY FLASH," and a final block 40, called "END"; three processing blocks 36, 37, 38 separate from each other; and a decision block 39.

Initially, block 36, the new data that must be stored in the memory cells 7 are inserted in the successive approximations register 23 ("REG (i)=NEWDATA").

Then, block 37, the writing algorithm ("WRITE PULSE ALGORITHM") is carried out.

Afterward, block 38, after the analog-to-digital conversion device 24 has generated current signals as a function of the data stored in the register 23, the assignment on the path 30 ("DAOUT=D/A (REG)") is carried out.

Therefore, decision block 39, the value of the current that flows from the flash cell 7, applied on the path 31, is compared with the value of the current present on the path 30 ("IN<DAOUT"?"). If the current from the flash cell 7 is not less than the current from the DAC 24 on line 30 (outcome NO of the block 39), then the algorithm of writing, block 37 ("WRITE PULSE ALGORITHM"), is carried out again. If the current from the flash cell 7 is less than the current from the DAC 24 on line 30 (outcome YES of the block 39), then the program of in-writing verification gets to an end, block 40 ("END").

By using this method the programming state of a memory cell 7 with $m=2^n$ different levels of threshold voltages is verified in a single step for each cycle of comparison thus obtaining a reduction in the time for the operation of verification as compared with the known method that, for this operation, involves a real reading of the cell, that is a control to be carried out in n steps.

The operations of programming and verification go on until the comparison gives favorable result, that until the cell is programmed at the desired threshold value.

It is possible to estimate the maximum time needed to program a cell 7, according to the following symbology, as:

Tprog (1 cell)=Np x (Tp+Tv+Tw);Tp=programming pulse time;

Tv=verification operation time;

Np=maximum number of programming pulses;

Tw=dead time due to the passage from the programming stage to the one of verification and vice versa.

Considering that each cell 7 has n bits, the speed of writing, called "WRITE RATE" (WR), will be of:

WR=n/Tprog[bit/sec], equivalent to n/8Tprog[B/sec]. Equation 1

Figure 4:
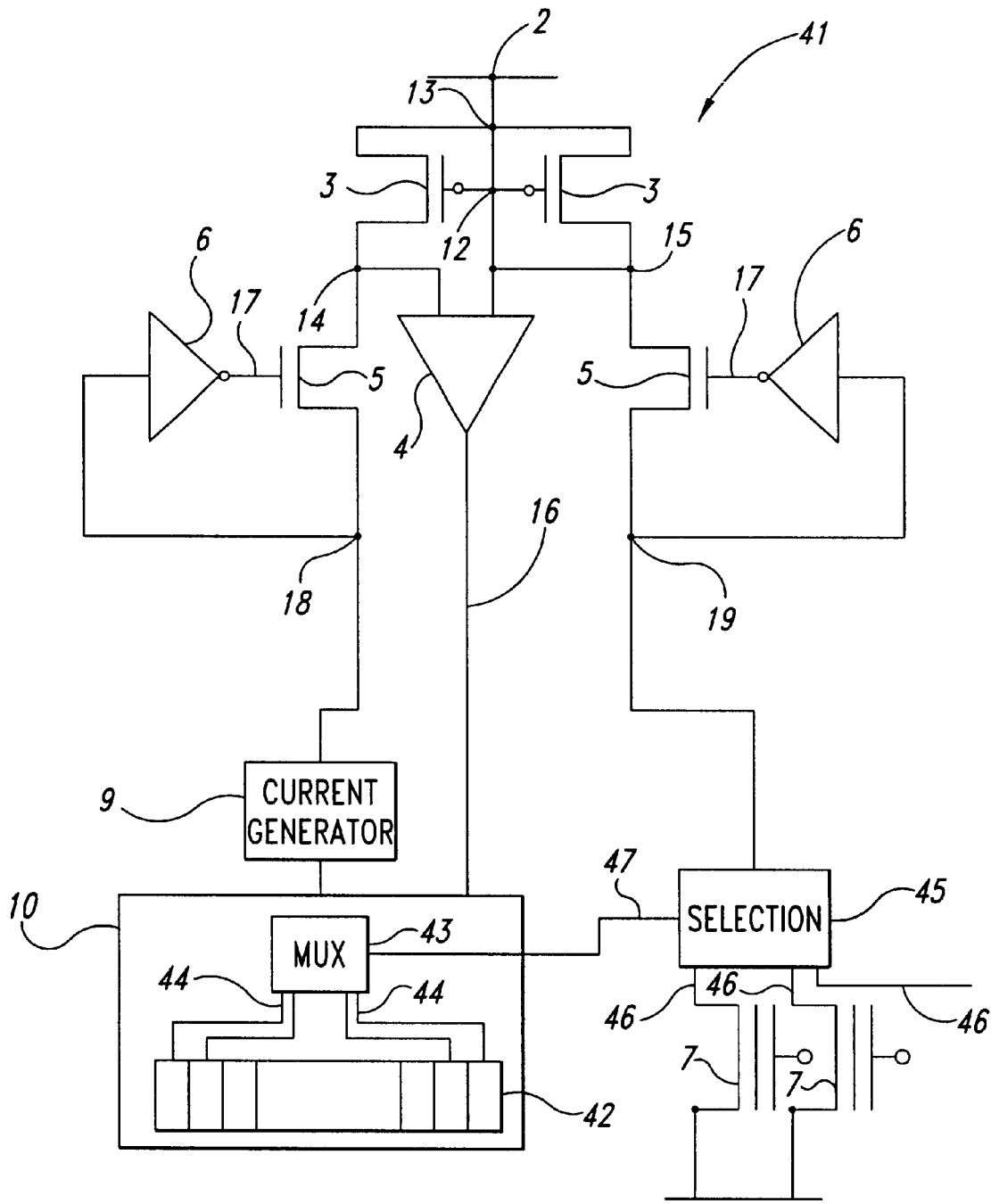
FIG. 4 illustrates a circuit layout of a sense amplifier modified according to an embodiment of the invention.

An embodiment of the present invention, as described in detail hereinafter with reference to FIG. 4, provides to use a number S of devices 1 in order to program and verify a number N of cells 7, with N>S, in such a way that at first the programming stage of all the N cells 7 occurs and subsequently the operation of verification takes place.

If S sense amplifiers 1 are used in parallel, the outcome is that the time for the programming of S cells 7 has a speed S—times greater than a serial operation using one sense amplifier. The optimum (ideal) case is obtained by increasing the number S of devices 1 in an indefinite way, but that puts limits in terms of circuit, high power consumption and occupation of area. Therefore the full parallelism on a considerable number of cells 7 can not be applied.

In FIG. 4 a simplified circuit layout of the invention at subject is indicated by 41 as a whole.

According to what illustrated in FIG. 4 it is possible to observe that the system is essentially identical to the one in FIG. 1 except for the fact that: 1) within the successive approximations register 10 there are a cluster of registers 42, made up of N/S registers each one with n bits (instead of a single register of n bits), a selection block 43 between the N/S registers of the cluster 42, called "MULTIPLEXER"; and a plurality of input lines 44 of the block 43 (in total, N/S clusters of input lines, each made up of n bits); 2) a selection block 45 for N/S cells 7 is provided, that is provided with a plurality of selection lines 46 (N/S lines 46 in total, each connected with a respective cell 7) and connected with the selection block 43 of the register 10 by a control line 47, called "MULTIPLEXER CONTROL" ("MUXCTRL").

Figure 5A:
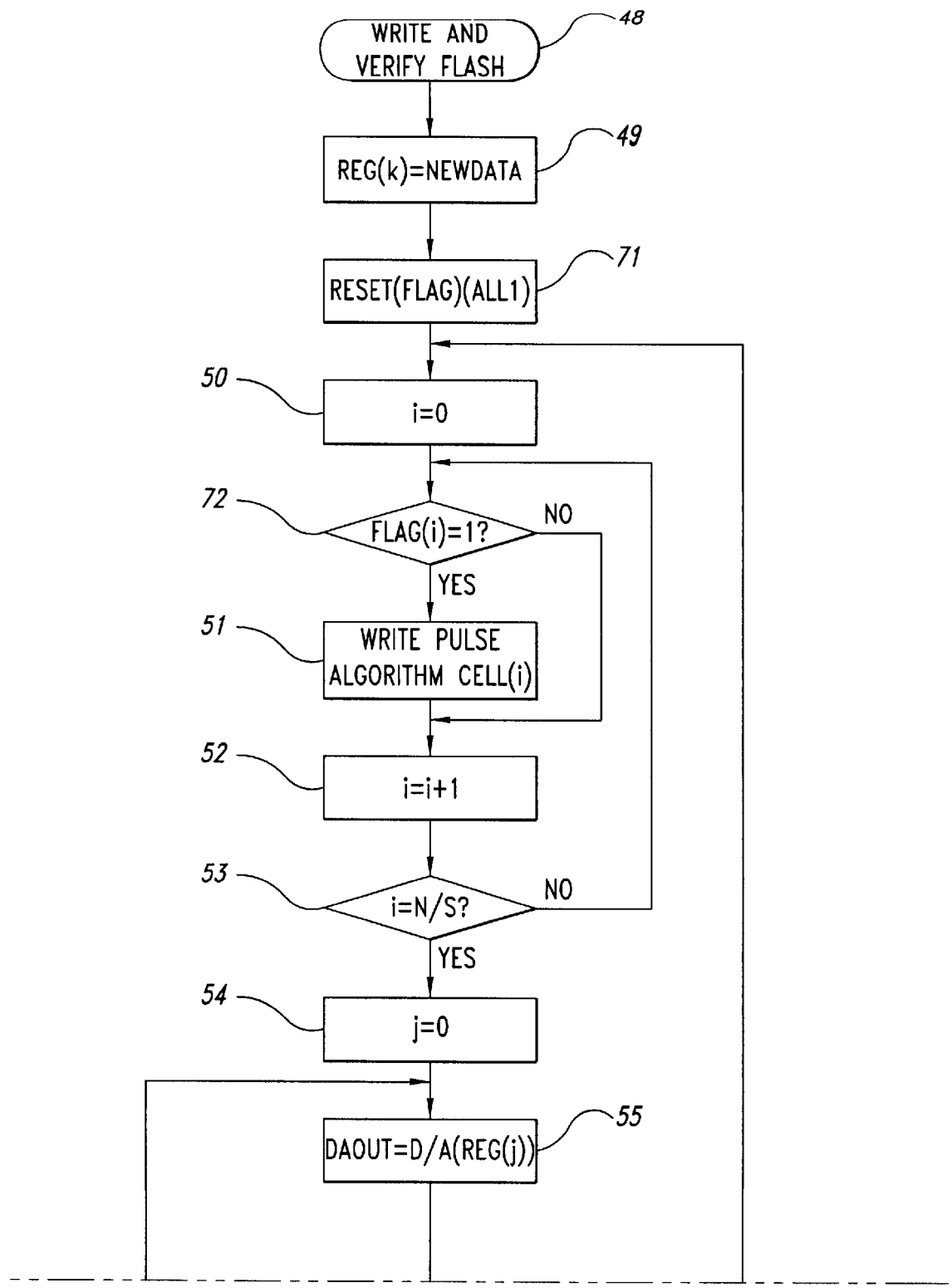
FIG. 5 show a flow chart relative to a method according to the invention that uses the sense amplifier in FIG. 4.
Figure 5B:
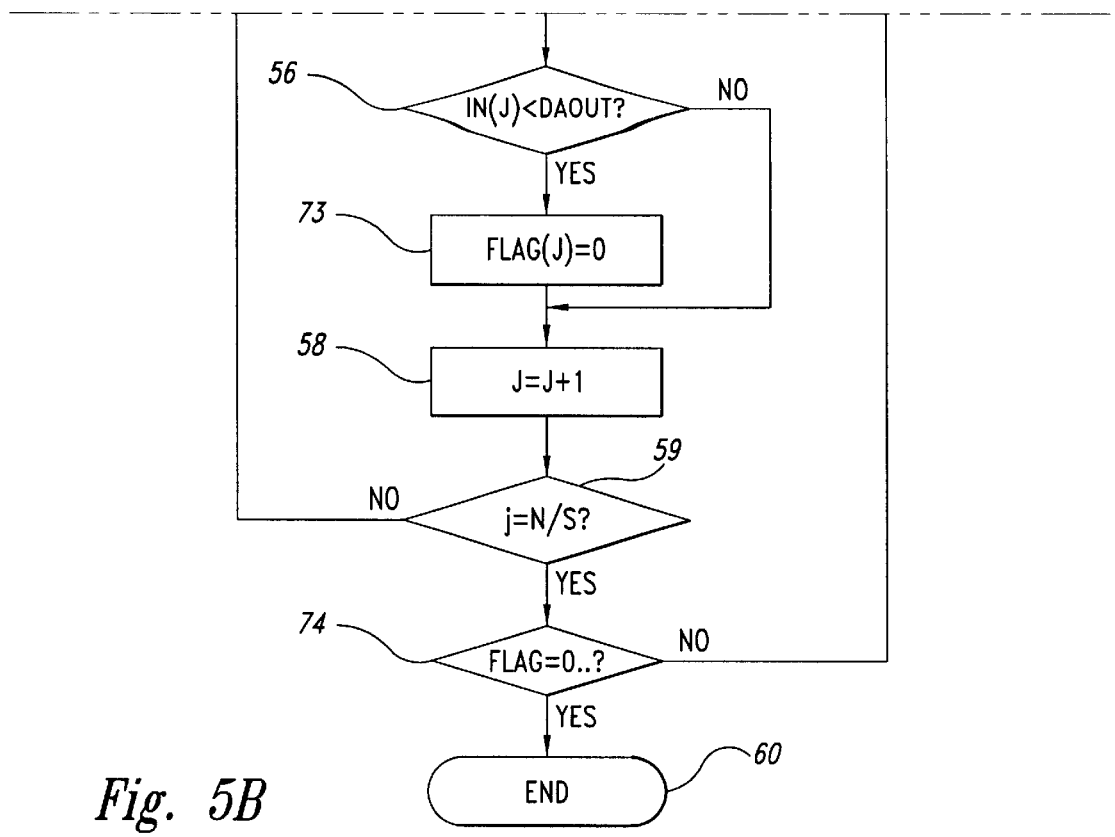

The operation of the layout 41 is described in detail with reference to the flow chart of FIG. 5, as shown hereinafter.

According to what illustrated in such figure it is possible to observe an initial block 48, called "WRITE & VERIFY FLASH," and a final block 60, called "END"; seven processing blocks 49, 50, 51, 52, 54, 55, and 58 distinct from each other; three decision blocks 53, 56, 59 distinct from each other.

Initially, block 49, in the N/S registers of the cluster 42 the values to be written in the corresponding N/S cells 7 are memorized ("REG (k)=NEWDATA"), with k that varies between 0 and N/S—1. A FLAG register containing N/S bits is then reset to "1", that is all the bits are set to "1" (block 71).

Therefore, block 50, a counter is initialized in such a way so as to detect which cell 7 and/or register 42 is being selected ("i=0"). Afterward, (block 72) it is verified that the value of the i-th bit of the FLAG register is equal to "1".

In an affirmative case the next step is block 51, that provides a programming pulse to one of the cells 7 according to the value of the counter "i" ("WRITE PULSE ALGORYTHM CELL (i)"), afterwards the program goes on to block 52, where the value of the counter is increased by a unit in order to select the next cell 7 ("i=i+1").

In case of negative outcome of the block 72, the program goes directly to block 52, thus skipping the block 51.

Therefore, decision block 53, it must be verified if all the N/S cells received the programming pulse ("i=N/S?"); in case the two variables do not coincide (outcome NO of block 53) the writing algorithm 51 ("WRITE PULSE ALGORYTHM CELL (i)") is carried out again on the next cell 7; in case the two variables coincide (branch YES of block 53) the program initializes another counter, block 54 ("j=0").

Afterward, block 55, after the digital-to-analog converter 24 has generated current signals, as a function of the data stored in the register 42 corresponding to the value of the counter "j," the assignment on the path 30 ("DAOUT=D/A (REG 0)") is carried out.

Therefore, decision block 56, the value of the current that flows from the flash cell 7 set on the path 31 is compared with the value of the current present on the path 30 ("IN (j)<DAOUT?"). In case the condition is verified (outcome YES of block 56), the FLAG 0) is set to "0" (block 73) and then the value of the counter is increased, block 58 ("j =j+1"), in such a way that the cell 7 following the one previously verified can be selected. In negative case (outcome NO of block 56) the program goes on directly to the entry of block 58.

Therefore, decision block 59, it is verified if all the N/S cells 7 have been verified ("j=N/S?"); in case the two variables do not coincide (outcome NO of the block 59) it is necessary to go back to block 55 ("DAOUT=D/A (REG j))"), and the part of program 55, 56, 73, 58, 59 is repeated in order to complete the verification of the remaining cells 7; in case the two variables coincide (YES branch of block 59) the next step is block 74, in which it is verified that all the bits of the FLAG are at "0". In an affirmative case the program ends, block 60 ("END"); in negative case the program repositions itself to the block 50.

The described procedure is repeated a number of times sufficient to bring all cells with FLAG to "0".

In this way it is possible to program in parallel N/S cells 7 sharing the same device 41.

Even in this situation it is possible to estimate the maximum time that is needed in order to program a cell 7, on the bases of the previously illustrated symbology, thus ascertaining that the programming stage has a time equal to N/S×Tp, the verification stage a time N/S×Tv, and a time Tw to go from the last operation of verification to the first operation of programming and vice versa. In addition when the operation of programming is carried out, if the stage of commutation from one cell to the other requires a time equal to Tpp (which is always much smaller than Tw), in order to supply pulses to all the cells 7 it will be necessary to use a dead time equal to N/S×Tpp. Similarly for the operation of verification, if the stage of commutation from one cell to the other requires a time Tvv (which is always much smaller than Tw), in order to verify all the cells 7 there will be a dead time equal to N/S×Tvv. In conclusion, the total dead time for each cycle of the programming and verification algorithm is given by:

Toh=Tw+(N/S)×(Tpp+Tvv).

What comes from it is that it is possible to program and verify N cells 7, while maintaining the parallelism of S devices 41, in a time thus expressed:

Tprog (N cells)=Np×[(Tp+Tv)×(N/S)+Toh].    Equation 2

The speed of writing, "WRITE RATE," is as a result equal to:

WR=(N×n)/Tprog (N cells)[bit/sec]or equally WR=(N×n)/ 8Tprog(N cells)[B/sec].    Equation 2

By expressing the ratio between the speed of writing expressed by Equations 1 and 2, we obtain that:

S×[1Tw/(Tp+Tv)]/[1+(S/N)×Toh/(Tp+Tv)]=S×A where the ratio of the two expressions in square brackets is indicated by A.

The expression A becomes greater than the unit for (N/S) sufficiently big and with N growing, and this translates into an increase in speed for the programming and verification of the cells 7.

Figure 6:
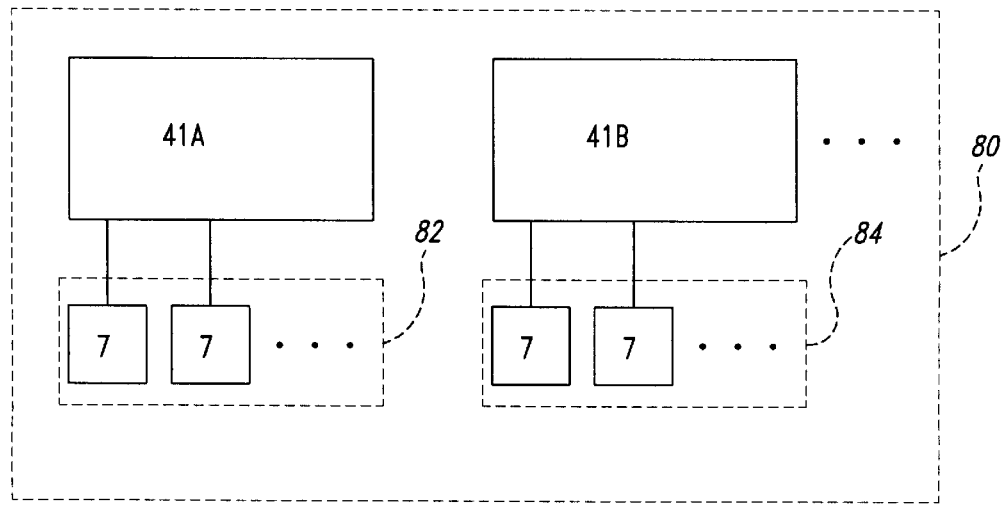
FIG. 6 is a block diagram of a memory device with plural sense amplifiers according to an embodiment of the invention.

FIG. 6 is a block diagram of a memory device 80 that includes first and second sense amplifiers 41A and 41B according to an embodiment of the invention. The first sense amplifier 41A is coupled to a first plurality 82 of memory cells 7 and the second sense amplifier 41B is coupled to a second plurality 84 of memory cells 7. The first and second sense amplifiers 41A, 41B are identical in structure and operation to the sense amplifier 41 shown in FIG. 4. Although only two sense amplifiers 41A, 41B and two pluralities 82, 84 of memory cells are shown in FIG. 6, it will be recognized that, to program and verify all N memory cells of the memory device 80, the memory device 80 includes S sense amplifiers and N/S memory cells coupled to each of the S sense amplifiers.

The architecture previously described, therefore, is as a result a good compromise between full parallelism, very fast but bulky and with high power consumption, and the completely serial operation, slower but more compact and at low power.

Finally, it is apparent that many modifications and variants can be made to the method described and illustrated here, all of which come within the scope of the invention, as defined in the attached claims, and the equivalents thereof.

We claim:

1. A method for in-writing verification of a threshold value of multilevel cells, suitable to memorize n bits each, using a sense amplifier that includes a register with n bits, a generator of reference current that varies as a function of a datum contained in said register, and a circuit for comparing the reference current produced by said generator and a current that flows in a selected one of said memory cells, the method comprising:

(a) loading a datum, intended for the selected memory cell, in the register;

(b) applying at least one programming pulse;

(c) comparing the reference current corresponding to said datum loaded in the register and the current that flows in the selected memory cell; and repeating steps (b), (c) until it is verified that the current of the selected memory cell is smaller than said reference current.

2. The method according to claim 1, wherein said register is a part of a successive approximations register that also includes a control circuit that is controlled by the output signal of a comparison circuit, the method further comprising, in normal conditions of reading of the selected cell, loading in said register data that vary as a function of the outcome of said comparison circuit according to a subsequent approximations algorithm.

3. The method according to claim 1, further comprising: using S>1 sense amplifiers, each one for the verification of respective N/S cells, with N>S, and each containing in a respective successive approximations register a number N/S of registers with n bits, first means for the selection of one of said N/S registers, seconds means for the selection of one of said N/S cells associated with the sense amplifier;

loading a respective datum as a function of a value that is intended to be memorized in the cells in each of the S sense amplifiers;

applying a programming pulse to each of the N cells;

verifying in parallel S of said cells, one for each of the S sense amplifiers;

comparing a reference current corresponding to the i-th register of each sense amplifier, selected by said first selection means, with the current that flows in corresponding cells of each sense amplifier, that are selected by said second selection means; and repeating the steps of applying a programming pulse to each of the N cells, verifying in parallel S of said cells, and comparing a reference current corresponding to the i-th register of each sense amplifier with the current that flows in corresponding cells of each sense amplifier until it is verified that the current of the corresponding cells is lower than said reference current.

4. A method of verifying contents of a first memory cell during a phase of writing to the first memory cell, the method comprising:

loading into a first register a first digital value desired to be written to the first memory cell;

producing an analog first reference current corresponding to the first digital value loaded into the first register;

providing a programming pulse to the first memory cell, thereby producing a first cell current through the first memory cell;

comparing the first cell current with the first reference current; and repeating the providing and comparing steps until the first cell current reaches the first reference current.

5. The method of claim 4, further comprising reading the first memory cell by loading in a reading register initial read data; producing a read reference current based on the initial read data; providing a reading bias to the first memory cell, thereby producing a read cell current through the memory cell; comparing the read reference current to the read cell current; varying the read data in the reading register as a function of comparing the read reference current to the read cell current.

6. The method of claim 4, further comprising reading the first memory cell by successively performing the following steps for I equal to 0 to n−1, where n is a number of bits able to be stored in the memory cell:

setting an i-th bit of an n-bit successive approximations register equal to a first logic state;

converting contents of the successive approximations register into an analog read reference current;

producing a read cell current in the first memory cell by applying a read bias to the first memory cell;

comparing the read reference current to the read cell current;

leaving the i-th bit at the first logic state if a result of comparing the read reference current to the read cell current is a first value; and switching the i-th bit to a second logic state if the result of comparing the read reference current to the read cell current is a second value.

7. The method of claim 4 wherein the cell current initially is higher than the reference current.

8. The method of claim 4, further comprising:

loading into a second register a second digital value desired to be written to a second memory cell;

producing an analog second reference current corresponding to the second digital value loaded into the second register;

providing a programming pulse to the second memory cell, thereby producing a second cell current through the second memory cell;

comparing the second cell current with the second reference current; and repeating the steps of providing a programming pulse to the second memory cell and comparing the second cell current with the second reference current until the second cell current reaches the second reference current, wherein the steps of providing programming pulses to the first and second memory cells are both completed before performing the steps of comparing the first and second cell currents with the first and second reference currents, respectively.

9. The method of claim 8 wherein the steps of comparing the first and second cell currents with the first and second reference currents, respectively, are performed using a same sense amplifier.

10. The method of claim 8, further comprising:

loading into a third register a third digital value desired to be written to a third memory cell;

producing an analog third reference current corresponding to the third digital value loaded into the third register;

providing a programming pulse to the third memory cell, thereby producing a third cell current through the third memory cell;

comparing the third cell current with the third reference current; and repeating the steps of providing a programming pulse to the third memory cell and comparing the third cell current with the third reference current until the third cell current reaches the third reference current, wherein the steps of comparing the first and second cell currents with the first and second reference currents, respectively, are performed using a first sense amplifier and the step of comparing the third cell current with the third reference current is performed using a second sense amplifier.

11. A memory device comprising:

a first plurality of memory cells;

a first sense amplifier coupled to the first plurality of memory cells and including:

a first set of plural registers, each register storing a respective digital value intended to be stored in a corresponding memory cell of the first plurality of memory cells;

a first selector that selects one of the registers of the first set;

a second selector that selects the memory cell corresponding to the register selected by the first selector;

a first reference current generator that generates a first reference current corresponding to the digital value stored in the selected register of the first set;

a first comparator that compares the first reference current to a first cell current flowing through the selected memory cell in response to a programming pulse being applied to the selected memory cell;

a second plurality of memory cells; and a second sense amplifier coupled to the second plurality of memory cells and including:

a second set of plural registers, each register storing a respective digital value intended to be stored in a corresponding memory cell of the second plurality of memory cells;

a third selector that selects one of the registers of the second set;

a fourth selector that selects the memory cell corresponding to the register selected by the third selector;

a second reference current generator that generates a second reference current corresponding to the digital value stored in the selected register of the second set;

a comparator that compares the second reference current to a second cell current flowing through the selected memory cell of the second set in response to a programming pulse being applied to the selected memory cell of the second set.

12. A memory device, comprising:

a first plurality of memory cells;

a first set of plural registers, each register storing a respective digital value intended to be stored in a corresponding memory cell of the first plurality of memory cells;

a first selector that selects one of the registers of the first set of registers;

a second selector that selects the memory cell corresponding to the register selected by the first selector;

a first reference current generator that generates a first reference current corresponding to the digital value stored in the selected register;

a first sense amplifier coupled to the first plurality of memory cells and to the first set of plural registers through the first selector, the first sense amplifier being able to amplify a second current flowing through the memory cell selected by the second selector in response to a programming pulse being applied to the selected memory cell; and a first comparator that compares the first reference current to the second current.

13. The memory device of claim 12 wherein the first selector is structured to sequentially select each of the registers of the first set and the second selector is structured to sequentially select each of the memory cells of the first plurality of memory cells in cooperation with the sequential selection by the first selector.

14. A memory device comprising:

a first plurality of memory cells; and a first sense amplifier coupled to the first plurality of memory cells and including:

a first set of plural registers, each register storing a respective digital value intended to be stored in a corresponding memory cell of the first plurality of memory cells;

a first selector that selects one of the registers of the first set;

a second selector that selects the memory cell corresponding to the register selected by the first selector;

a first reference current generator that generates a first reference current corresponding to the digital value stored in the selected register;

a first comparator that compares the first reference current to a first cell current flowing through the selected memory cell in response to a programming pulse being applied to the selected memory cell;

the first sense amplifier being structured to sequentially select the memory cells of the first plurality of memory cells and to sequentially apply programming pulses to each of the memory cells of the first plurality of memory cells before sequentially comparing cell currents through the respective memory cells of the first plurality of memory cells with respective reference currents.

* * * * *